United States Patent [19]

Osburn et al.

[11] Patent Number: 4,742,312
[45] Date of Patent: May 3, 1988

[54] POWER LIMITING AUDIO AMPLIFIER TEMPERATURE PROTECTION CIRCUIT

[75] Inventors: David W. Osburn; David A. LaRosa, both of Kokomo; James R. Knolinski, West Lafayette, all of Ind.

[73] Assignee: Delco Electronics Corporation, Kokomo, Ind.

[21] Appl. No.: 52,984

[22] Filed: May 22, 1987

[51] Int. Cl.⁴ .......................... H03F 1/52; H02H 7/20
[52] U.S. Cl. .................................... 330/298; 330/146; 330/207 P; 361/91; 361/98
[58] Field of Search ............... 330/146, 256, 266, 272, 330/289, 298, 207 P; 361/78, 88, 91, 93, 98, 103

[56] References Cited

U.S. PATENT DOCUMENTS

| | | | |
|---|---|---|---|
| 4,053,996 | 10/1977 | Schertz | 361/98 |
| 4,158,180 | 6/1979 | Challen | 330/298 |
| 4,345,218 | 8/1982 | Congdon et al. | 330/298 |
| 4,530,026 | 7/1985 | Noro | 361/88 |

Primary Examiner—James B. Mullins
Attorney, Agent, or Firm—Robert M. Sigler

[57] ABSTRACT

An audio amplifier of the type including circuitry to detect clipping and adjust the gain of an amplifier input element to control the clipping in closed loop operation further includes circuitry effective to sense the temperature of an amplifier component and change the amplifier bias voltage that determines the maximum non-clipping voltage so as to induce clipping in the amplifier when the temperature exceeds a predetermined temperature. The clipping control circuitry then reduces the input gain to the amplifier to control the clipping and, in so doing, reduces power dissipation to a level allowing the temperature to decrease to the predetermined temperature. The circuit provides for closed loop control of amplifier temperature in marginal temperature situations with minimal intrusion on the music reproduction process.

3 Claims, 1 Drawing Sheet

POWER LIMITING AUDIO AMPLIFIER TEMPERATURE PROTECTION CIRCUIT

BACKGROUND OF THE INVENTION

This invention relates to an improved audio amplifier protection circuit which limits the power dissipation of the amplifier as necessary to protect the amplifier from overheating. Such circuits are used in radio receivers and other music reproduction systems using complex impedance speaker systems in limited space environments subject to large fluctuations in ambient temperature.

Music program material, with its wide dynamic range provided to complex speaker loads, is well known to produce a much lower average power output than a sine wave of the same peak level. It is inefficient and expensive to design an amplifier to dissipate any peak power level expected under any ambient temperature conditions conceivable. In addition, the large heat sinks required produce bulky amplifier packages. Customers are not overly receptive to large, expensive amplifiers, particularly in such environments as motor vehicles, where space is at a premium and prices are highly competitive. Therefore, such amplifiers are generally designed for normal expected use, at significant savings in bulk and cost, with temperature protection circuits provided to handle the rare circumstances in which, due to high ambient temperature and high audio power, temperature protection is required.

The typical temperature protection circuit removes bias from the amplifier when the junction temperature of the amplifier IC exceeds a predetermined safe level. If the circuit removes the bias quickly in great quantity, this results in complete loss of audio output and may lead to the amplifier cycling on and off, since the amplifier cools when shut down and heats when turned on. If the bias is removed in a more controlled manner, in order to try to reduce the power level gradually, the result in many amplifiers can be unstable operation or crossover distortion. In addition, circuits allowing full output power up to the desired shut down temperature are difficult to calibrate precisely. There are several variables involved; and the result can be a tolerance level as high as plus or minus 20 degrees C. in the shut down temperature. There is need for a more precisely controllable temperature protection circuit for audio amplifiers that is less obtrusive to the listener.

An opportunity for just such a circuit exists in those audio amplifiers using a clipping detector to vary the gain of the input signal to reduce clipping distortion. The basis of this invention is the inclusion of the clipping detector in the temperature protection circuit by the inclusion of circuit elements reducing the allowable non-clipping voltage swing of the audio amplifier when the temperature thereof exceeds safe levels so as to induce clipping in the amplifier. The clipping detector thus causes a more precisely controllable reduction in gain and a consequent reduction in amplifier power for stable operation at a lower power level.

SUMMARY OF THE INVENTION

The invention thus comprises a protection circuit for an audio amplifier of the type having a power supply effective to supply a bias voltage determining the maximum non-clipping audio output voltage, a clipping detector effective to detect clipping in the audio output and generate a signal thereof, a circuit effective to detect the temperature of a component of the audio amplifier and generate a signal thereof and a variable gain circuit providing the input to the audio amplifier. The protection circuit further comprises first circuit elements responsive to the signal from the temperature detecting circuit to change the bias voltage supplied by the power supply to the amplifier in the direction of smaller maximum non-clipping audio output voltage when the temperature exceeds a predetermined temperature so as to induce clipping in the amplifier when the temperature of the component exceeds the predetermined temperature. The protection circuit additionally comprises second circuit elements responsive to the clipping signal to reduce the gain of the variable gain circuit in closed loop to limit the clipping of the amplifier and thus, when clipping is initiated by the first circuit elements in response to a temperature exceeding the predetermined temperature, to reduce the power dissipation of the amplifier and the temperature thereof.

The amplifier may be of the bridge audio type and be provided with a full bias voltage and a half bias voltage derived from the full bias voltage in a voltage divider and applied as the bias voltage to the bridged amplifier circuits, whereby the combination of full and half bias voltages determines the clipping level of the amplifier. The first circuit elements may thus comprise a transistor biased into increasing conduction at temperatures above the predetermined temperature and connected to shunt current away from the resistance of the voltage divider effective to reduce the half bias voltage without decreasing the full bias voltage. Further details and advantages of the invention will be apparent from the accompanying drawings and following description of a preferred embodiment.

DESCRIPTION OF A PREFERRED EMBODIMENT

Figure 1:
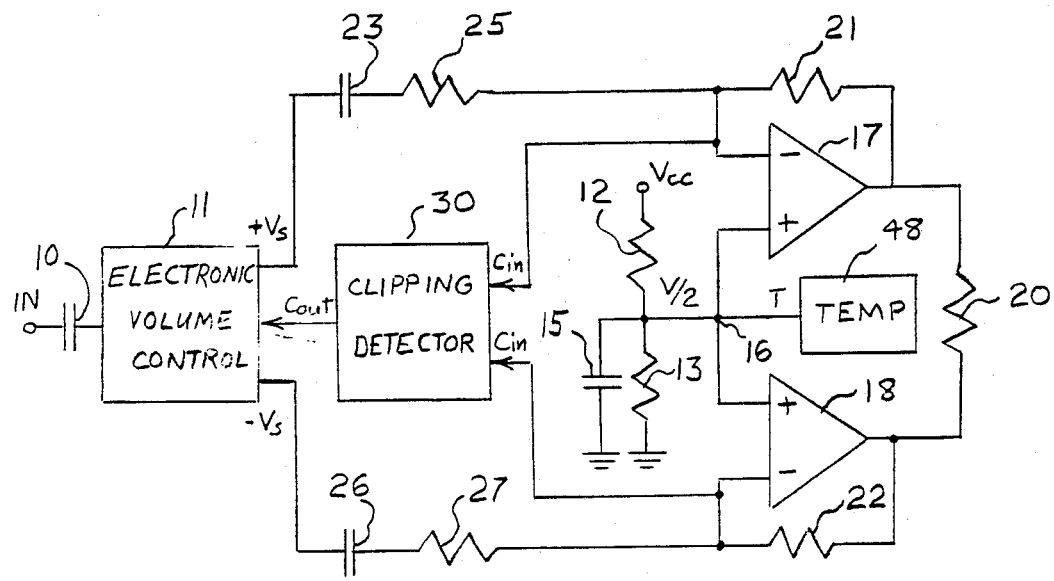
FIG. 1 is a block and circuit diagram of an amplifier with a protection circuit according to this invention.

Referring to FIG. 1, an amplifier comprises an input terminal, labeled IN, adapted to receive an input voltage signal. This input terminal is shown coupled through a capacitor 10 to an electronic volume control 11, of the type including a variable gain amplifying element. The output of electronic volume control 11 is complementary relative to a half bias voltage V/2. Electronic volume control 11 is currently used in motor vehicle radios produced by the Delco Electronics Corporation, but the variable gain portion of the circuit relevant to this description could be replaced by a simple variable gain amplifying circuit well known in the prior art.

Voltage regulating circuits of standard construction, not shown, provide a full bias voltage $V_{cc}$, which is applied to the circuit chips of the amplifier as the power supply voltage thereof and to the terminal labeled $V_{cc}$ in FIG. 1. A pair of identical resistors 12, 13 are connected in series across $V_{cc}$, with resistor 12 connected to terminal $V_{cc}$ and resistor 13 connected to ground. A capacitor 15 may be connected to ground in parallel with resistor 13. Junction 16 of resistors 12 and 13 provides the half bias voltage V/2 where it is required and particularly to the non-inverting inputs of power output amplifiers 17 and 18 having outputs connected in a bridge configuration across a load 20, which is shown as a resistor for convenience but which actually represents the complex load of a speaker system. Amplifiers 17 and 18 have feedback resistors 21 and 22, respectively, connected to the inverting inputs thereof, which inverting inputs are also provided with input signal voltages complementary with respect to V/2. Output voltage $+V_s$ from electronic volume control 11 is provided through capacitor 23 and input resistor 25 to the inverting input of amplifier 17; and output voltage $-V_s$ from electronic volume control 11 is provided through capacitor 26 and input resistor 27 to the inverting input of amplifier 18.

A clipping detector 30 has a pair of input terminals $C_{in}$ connected to the inverting inputs of amplifiers 17 and 18 and an output terminal $C_{out}$ connected to the gain control terminal of electronic volume control 11. Clipping detector 30 is shown in greater detail in FIG. 2. Inputs $C_{in}$ are connected to the bases of NPN transistors 31 and 32, respectively, the emitters of which are connected through a standard bipolar IC current source 33 to ground. Transistors 31 and 32 have collectors connected through load resistors 35 and 36, respectively, to voltage $V_{cc}$ and form a differential gain stage. A PNP transistor 37 has an emitter connected to the collector of transistor 32 and a base connected to the collector of transistor 31. A PNP transistor 38 has an emitter connected to the collector of transistor 31 and a base connected to the collector of transistor 32. Transistors 37 and 38 have collectors connected through a resistor 40 to ground and also to the base of an NPN transistor 41 having a grounded emitter and a collector connected through a resistor 42 to terminal $C_{out}$. Transistors 37, 38 and 41 thus form a threshold detector with an open collector output. Terminal $C_{out}$ is also connected through a resistor 43 to voltage $V_{cc}$ and through a capacitor 45 to ground.

In the operation of the system described so far, the inverting inputs of amplifiers 17 and 18 are normally maintained at the half bias voltage V/2. When clipping occurs in one of amplifiers 17 and 18, however, the associated negative feedback path can no longer maintain the voltage at this level. Significant clipping will cause one of transistors 31 and 32 of clipping detector 30 to be forward biased, causing conduction of transistor 41 and a decrease in the output voltage at terminal $C_{out}$. This voltage, applied to the gain control input of electronic volume control 11, reduces the gain thereof and thus causes a reduction in peak-to-peak signal level in the amplifiers 17 and 18. This, in turn, reduces the clipping; and a stable degree of clipping is achieved in closed loop. A variation of the electronic volume control would be a more complicated circuit which first rolls off the bass response before reducing overall gain, since bass notes in music are generally the largest peak-to-peak signals and since amplifier temperature problems are often associated with the listener turning the bass control to its upper limit. Circuits to accomplish this are also well known.

Figures 2, 3:
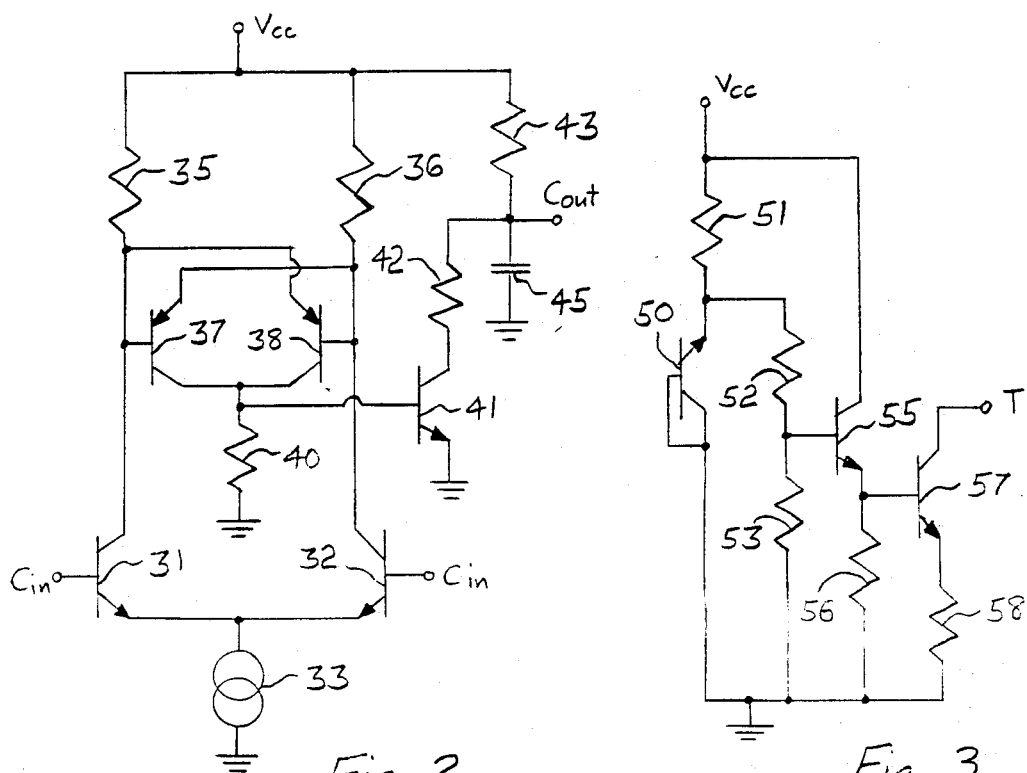
FIG. 2 is a circuit diagram of a clipping detector for use in the circuit of FIG. 1.
FIG. 3 is a circuit diagram of a temperature sensing and bias adjusting circuit for use in the circuit of FIG. 1.

In order to incorporate the clipping control in the temperature protection circuit, a temperature sensing circuit 48 is included as shown in FIG. 3. The circuit relies on the negative temperature coefficient of a bipolar junction potential at a given current level. An NPN transistor 50 has a base tied to its grounded collector and an emitter connected through a resistor 51 to voltage $V_{cc}$. Transistor 50 is thus connected as a zener diode and provides a reasonably stable reference voltage at its emitter, which is connected through a pair of resistors 52 and 53 to ground. The junction of resistors 52 and 53 is connected to the base of an NPN transistor 55 having a collector connected to voltage $V_{cc}$ and an emitter connected through a resistor 56 to ground. The emitter of transistor 55 is connected to the base of an NPN transistor 57 having an emitter connected through a resistor 58 to ground and a collector, labeled terminal T, connected to the half bias voltage junction 16.

In operation, the circuit is adjusted so that transistor 57 does not conduct at temperatures below the predetermined temperature which represents the highest desired temperature the amplifier is allowed to reach before corrective action is taken. As increasing temperature reduces the base-emitter junction voltages of transistors 55 and 57, transistor 57 will begin to conduct a significant current at the predetermined temperature, which current shunts resistor 13 and thereby lowers the half bias voltage applied to amplifiers 17 and 18 without reducing the full bias voltage or, directly, the signal level. With the half bias voltage reduced, amplifiers 17 and 18 will clip at a lower maximum peak-to-peak signal level, the precise level depending on the drop in the half bias voltage and thus in the increase in temperature over the predetermined temperature. An overtemperature condition thus induces clipping in amplifiers 17 and 18, which automatically activates the clipping detection loop to reduce the signal level. The clipping control loop, already described, ensures that the signal level decreases to the point of minimal clipping. However, the temperature circuit ensures that overtemperature produces more than minimal clipping. Therefore, the signal level will be reduced until the temperature falls to the predetermined temperature, at which point it will stabilize. The slight clipping is less objectionable to the listener than the amplifier cycling on and off or producing strong crossover distortion. The system automatically provides the minimal correction required for protection in the least obtrusive way and recovers when conditions improve.

The embodiments of the invention in which an exclusive property or privilege is claimed are defined as follows:

1. A protection circuit for an audio amplifier of the type having a power supply effective to supply a bias voltage determining the maximum non-clipping audio output voltage, a clipping detector effective to detect clipping in the audio output and generate a signal thereof, a circuit effective to detect the temperature of a component of the audio amplifier and generate a signal thereof and a variable gain circuit providing the input to the audio amplifier, the protection circuit comprising:

first circuit elements responsive to the signal from the temperature detecting circuit to change the bias voltage supplied by the power supply to the amplifier in the direction of smaller maximum non-clipping audio output voltage when the temperature exceeds a predetermined temperature so as to induce clipping in the amplifier when the temperature of the component exceeds the predetermined temperature;

second circuit elements responsive to the signal from the clipping detector to reduce the gain of the variable gain circuit in closed loop to limit the clipping of the amplifier and thus, when clipping is initiated by the first circuit elements in response to a temperature exceeding the predetermined temperature, to reduce the power dissipation of the amplifier and the temperature thereof.

2. A protection circuit for an audio amplifier of the type having two amplifying circuits with bridge connected outputs, a power supply effective to supply to the amplifying circuits a full bias voltage and a half bias voltage together determining the maximum non-clipping audio output voltage, a clipping detector effective to detect clipping in the audio output and generate a signal thereof, a circuit effective to detect the temperature of a component of the audio amplifier and generate a signal thereof and a variable gain circuit providing the input to the audio amplifier, the protection circuit comprising:

first circuit elements responsive to the signal from the temperature detecting circuit to change the half bias voltage supplied by the power supply to the amplifier in the direction of smaller non-clipping audio output voltage, without so changing the full bias voltage, when the temperature exceeds a predetermined temperature so as to induce clipping in the amplifier when the temperature of the component exceeds the predetermined temperature;

second circuit elements responsive to the clipping signal to reduce the gain of the variable gain circuit in closed loop to limit the clipping of the amplifier and thus, when clipping is initiated by the first circuit elements in response to a temperature exceeding the predetermined temperature, to reduce the power dissipation of the amplifier and the temperature thereof.

3. The protection circuit of claim 2 in which the half bias voltage is derived from the full bias voltage in a voltage divider having a pair of substantially equal resistances across the full bias voltage and the first circuit elements include a transistor biased to increase its conduction with higher temperature, above the predetermined temperature as sensed by the first circuit elements, and connected to the voltage divider to shunt current away from the one of the resistances effective to lower the half bias voltage with increasing temperature above the predetermined temperature.

* * * * *